United States Patent [19]
Shishiguchi et al.

[11] Patent Number: 5,858,853
[45] Date of Patent: *Jan. 12, 1999

[54] METHOD FOR FORMING CAPACITOR ELECTRODE HAVING JAGGED SURFACE

[75] Inventors: Seiichi Shishiguchi; Tatsuya Suzuki; Hideo Kawano; Keiji Shiotani; Masao Mikami, all of Tokyo, Japan

[73] Assignee: NEC Corporation, Tokyo, Japan

[ * ] Notice: The term of this patent shall not extend beyond the expiration date of Pat. No. 5,543,347.

[21] Appl. No.: 550,624

[22] Filed: Oct. 31, 1995

[30] Foreign Application Priority Data

Oct. 31, 1994 [JP] Japan .................................. 6-304137

[51] Int. Cl.$^6$ .................................................. H01L 21/20
[52] U.S. Cl. .......................... 438/398; 438/253; 438/255; 438/396; 148/DIG. 14
[58] Field of Search .................................. 438/253, 255, 438/396, 398; 148/DIG. 14

[56] References Cited

U.S. PATENT DOCUMENTS

| | | | |
|---|---|---|---|
| 5,110,752 | 5/1992 | Lu | 437/47 |
| 5,182,232 | 1/1993 | Chhabra et al. | . |
| 5,256,587 | 10/1993 | Jun et al. | . |
| 5,290,729 | 3/1994 | Hayashide et al. | 437/60 |
| 5,302,540 | 4/1994 | Ko et al. | 437/47 |
| 5,318,920 | 6/1994 | Hayashide | 437/47 |
| 5,387,531 | 2/1995 | Rha et al. | 437/52 |
| 5,427,974 | 6/1995 | Lur et al. | 437/919 |
| 5,466,626 | 11/1995 | Armacost et al. | 437/60 |
| 5,474,949 | 12/1995 | Hirao et al. | 437/60 |
| 5,474,950 | 12/1995 | Kim | 437/60 |
| 5,543,347 | 8/1996 | Kawano et al. | 437/919 |

FOREIGN PATENT DOCUMENTS 4-252018  9/1992  Japan .

OTHER PUBLICATIONS

Watanabe et al., "Hemispherical Grained Silicon (HSG–Si) Formation on In–Situ Phosphorous . . . Method", *Extd. Abs. of the 1992 Int'l. Conf. on Solid State Devs. & Mtls.*, Tsukuba, 1992, pp. 422–424.

Watanabe et al., "Device application and structure observation for hemispherical–grained Si", *J. Appl. Phys.*, vol. 71, No. 7, Apr. 1, 1992, pp. 3538–3543.

*Primary Examiner*—Tuan H. Nguyen
*Attorney, Agent, or Firm*—Sughrue, Mion, Zinn, Macpeak & Seas, PLLC

[57] ABSTRACT

In a method for forming a capacitor, after preparing a substrate having at least one device area thereon, an amorphous silicon film containing one type of dopant is formed on the device area. A mask layer comprising mask islands is formed and distributed on a surface of the amorphous silicon film. The surface of the amorphous silicon is dry-etched by using the mask layer as a selective etching mask to produce a jagged surface having a lot of protrusions. After forming the jagged surface, the amorphous silicon film is changed into a polycrystalline silicon film serving as a storage electrode. Finally, a dielectric film and then another storage electrode are formed sequentially on the jagged surface of the storage electrode.

40 Claims, 8 Drawing Sheets

109 AMORPHOUS SILICON FILM

110 CHROMIUM FILM
110a CHROMIUM SILICIDE LAYER
109

111 CHROMIUM SILICIDE ISLANDS (MASK LAYER)
109

111
112
109 AMORPHOUS SILICON FILM WITH A JAGGED SURFACE 112
113 POLYCRYSTAL SILICON FILM WITH A JAGGED SURFACE

METHOD FOR FORMING CAPACITOR ELECTRODE HAVING JAGGED SURFACE

BACKGROUND OF THE INVENTION

1. Field of the Invention

The present invention relates to a method for forming a capacitor for use in a semiconductor device, and in particular to a method for forming an electrode of the capacitor having a lot of small protrusions on the surface thereof.

2. Description of the Related Art

In recent years, the size of a semiconductor memory is reduced with the high integration of Dynamic Random Access Memories. This causes the area of a memory cell capacitor to be reduced, and consequently a problem arises such that the capacitance of a memory cell is also reduced. Then, in order to achieve sufficient capacitance, there have been proposed several methods of increasing a capacitor area without reducing the thickness of an insulation film.

For example, a method described in Japanese Patent Laid-open Publication No. 4-252018 is shown in FIGS. 1A and 1B. An amorphous insulation film (oxide film) 2 is formed on a substrate 1, and then an amorphous silicon 3 is formed on the insulation film 2. Immediately after formation of the amorphous silicon 3, plasma hydrogen 4 is supplied to the surface of the amorphous silicon 3 without exposing it to the air. The surface atoms of the amorphous silicon 3 are terminated by the hydrogen atoms 5 and become inactive. Therefore, even if it is left in the atmosphere for a long period of time, formation of a natural oxide film would be prevented. Since these hydrogen atoms 5 are dissociated from silicon atoms at a lower temperature than the amorphous silicon layer 3 crystallizes, a clean surface is obtained prior to the crystallization of amorphous silicon. The diffusion speed of the silicon atoms on the clean surface is extremely fast, so that seed grains are formed and grown on the surface of the amorphous silicon 3, and as shown in FIG. 1B there is formed polycrystalline silicon 7 having a lot of hemispherical polycrystalline grains 6 on its surface, resulting in very large surface area. If the polycrystalline silicon 7 formed in this way is used as a storage electrode, the capacitance is approximately twice or more as large as in a case where plasma hydrogen 4 is not supplied to the amorphous silicon 3.

However, the conventional method has practical difficulties since the clean surface of the amorphous silicon 3 is unstable and difficult to hold for a long period of time. Moreover, heat treatment under very high vacuum conditions is needed for grain formation and growth. Therefore, the equipment for forming the polycrystalline silicon 7 is expensive, and temperature control of the heat treatment is not easy because an allowable range of heat treatment temperature is narrow.

In addition, for the conventional method, it is necessary to polycrystallize the amorphous silicon 3 before patterning for formation of the storage electrode because it is very difficult to hold the clean surface of the amorphous silicon 3 under patterning by means of photolithography. This causes the process design to be reduced in flexibility.

SUMMARY OF THE INVENTION

Accordingly, it is an object of the present invention to provide a method of stably forming a storage electrode having a large surface area with a simpler process.

Another object of the present invention is to provide a method of forming a storage electrode having a uniformly jagged surface through easy control.

Still another object of the present invention to provide a method of forming a storage electrode having a large surface area without restricting the flexibility of process design.

In accordance with a first aspect of the present invention, after preparing a substrate having at least one device area thereon, an amorphous silicon film containing one type of dopant is formed on the device area. A mask layer is formed on a surface of the amorphous silicon film, the mask layer comprising mask islands distributed on the surface. Subsequently, the surface of the amorphous silicon is dry-etched by using the mask layer as a selective etching mask to produce a jagged surface having a lot of protrusions. After forming the jagged surface of the amorphous silicon film, the amorphous silicon film is changed into a polycrystalline silicon film serving as a storage electrode. Finally, depositing a dielectric film and then another storage electrode sequentially on the jagged surface of the storage electrode, the capacitor is completed.

In accordance with a second aspect of the present invention, the mask layer is formed as follows. First, a metal film is deposited on the amorphous silicon film to produce an intermediate layer in an interface between the metal film and the amorphous silicon film. The intermediate layer is comprised of a compound formed by the reaction of a metal material of the metal film with a silicon material of the amorphous silicon film. For example, the metal material is chromium (Cr), tungsten (W), or titanium (Ti). Subsequently, the metal film is removed from the surface of the amorphous silicon film by anisotropic etching such that the intermediate layer is left in a pattern of islands on the surface of the amorphous silicon film. The intermediate layer of a pattern of islands is used as the mask layer.

In accordance with a third aspect of the present invention, the mask layer is formed as follows. First, the substrate having the amorphous silicon film formed is placed within a chamber for use in CVD (chemical vapor deposition). A mixture gas comprising a tungsten hexafluoride ($WF_6$) gas and a hydrogen ($H_2$) gas is supplied into the chamber, and then tungsten islands are deposited by CVD on condition that a partial pressure of the $WF_6$ gas falls within a predetermined range which depends on a desired shape of each said tungsten islands. This condition causes the tungsten islands to be formed and distributed on the surface of the amorphous silicon film. The tungsten islands are used as the mask layer. The partial pressure of the $WF_6$ gas falls within the range from $13.3 \times 10^{-3}$ Pa to $133 \times 10^{-3}$ Pa. A width of each tungsten island can be varied in accordance with the partial pressure of the $WF_6$ gas.

In accordance with a fourth aspect of the present invention, a rounding step of round-shaping the crest of each protrusion of the jagged surface is performed following the step of producing the jagged surface having a lot of protrusions.

The rounding step is preferably performed by oxidizing the jagged surface of the amorphous silicon film to form a silicon oxide layer in the jagged surface, and then removing the silicon oxide layer from the jagged surface of the amorphous silicon film. As another preferable example, the rounding step is performed by heating the amorphous silicon film in a dry oxygen atmosphere such that the amorphous silicon film is changed into the polycrystalline silicon film and a silicon oxide layer is formed in the jagged surface, and then removing the silicon oxide layer from the jagged surface of the polycrystalline silicon film.

The rounding step is also performed by annealing the polycrystalline silicon film. More specifically, the polycrystalline silicon film is annealed in a vacuum of below $133 \times 10^{-6}$ Pa and at a temperature ranging from 800° to 900° C.

Further the rounding step is performed by using a laser beam to anneal the jagged surface of the polycrystalline silicon film in an oxygen-free atmosphere. More specifically, the laser beam has an energy density ranging from 200 to 400 mJ/cm$^2$.

According to the present invention, the mask layer is formed on the surface of the amorphous silicon film and is used as a selective etching mask to dry-etch the surface of the amorphous silicon, resulting in a jagged surface having a lot of protrusions. Since the jagged surface can be obtained in a simple manner, it is not necessary to employ extra steps for keeping the surface of the amorphous silicon film clean. Therefore, the capacitor having a large capacitance is stably realized through a simple process and without restricting the flexibility of process design.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

FIRST EMBODIMENT

A first embodiment of the present invention is directed to a storage electrode of a stacked capacitor for use in a dynamic random access memory (DRAM).

Figure 1A:
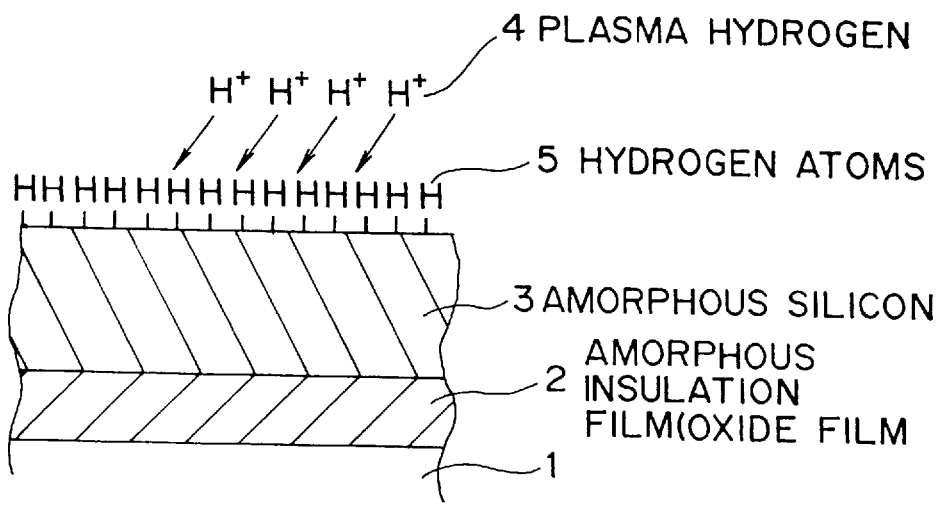
FIGS. 1A and 1B are diagrams showing a conventional method of forming the grained surface of a polycrystalline silicon film.
Figure 1B:
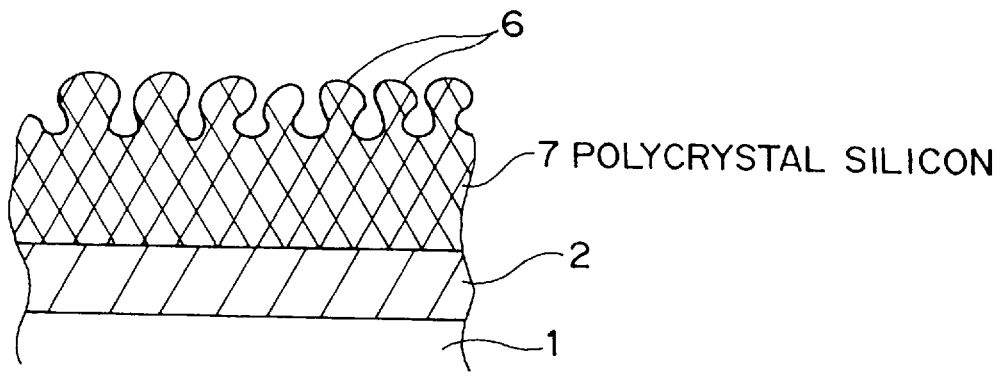
Figure 2A:
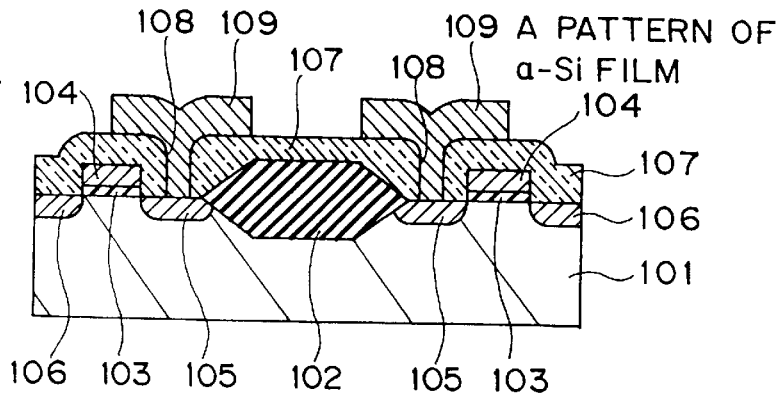
FIGS. 2A–2E are diagrams showing steps of forming a storage electrode of a polycrystalline silicon film having a jagged surface according to a first embodiment of the present invention.

Referring to FIG. 2A, the DRAM is formed on a P-type silicon substrate 101 of the crystal plane, (100), and the resistivity, 10 Ohm-cm. On the surface of the substrate 101, a plurality of cell areas are formed and isolated from each other by field oxide films 102 which are formed by means of LOCOS (Local Oxidation of Silicon). A gate oxide film 103 is deposited on the surface of the substrate 101 and then gate electrodes are formed in a predetermined pattern at a predetermined position for each cell area on the gate oxide film 103. The gate electrodes are designed to double as word lines each crossing over cell areas of one word for the DRAM.

After the gate electrodes has been formed on the gate oxide film 103, a pair of source and drain regions of N-type diffused layer are formed by means of self-alignment and then an isolation layer 107 is deposited on the cell areas and field oxide films 102 by a vapor deposition method. Subsequently, a node contact hole 108 for each cell area is formed reaching a predetermined one of the source and the drain regions 105 through the isolation layer 107.

A predetermined pattern of amorphous silicon (a-Si) film 109 which should serve as the storage electrodes is formed according to the following steps. First, a low-pressure chemical vapor deposition (LPCVD) apparatus is set at the furnace temperature 510° C. and the pressure 0.23 Pa. An a-Si film of 400 nm thick is deposited on the isolation layer 107 with supplying a $Si_2H_6$ gas at 100 sccm and a He-diluted $PH_3$ (1%) gas (dopant) at 100 sccm. After deposition, the pattern of a-Si film 109 is formed by etching the a-Si film by means of photolithography.

Figure 2B:
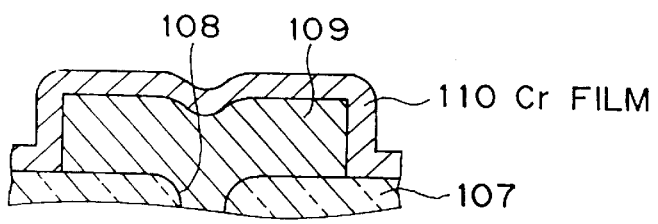

Referring to FIG. 2B, the substrate temperature is set at the room temperature, and a chromium (Cr) film 110 of thickness 150 nm is formed on the whole surface of the a-Si film 109 by sputtering. The metal film 110 may be another metal material such as tungsten or titanium.

Figure 2C:
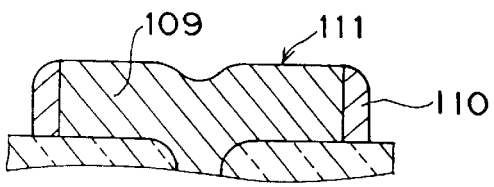

Consequently, as shown in FIG. 2C, by an anisotropic dry-etching method using a mixture gas of $Cl_2/O_2/H_2$, the chromium film 110 of thickness 150 nm is removed from the top of the a-Si film 109. After the dry-etching removal, it is observed by a high-powered microscope that the top surface of the a-Si film 109 is covered with an intermediate layer 111 (a very thin layer having uneven thickness or a lot of thin layer islands). The chromium film 110 is left on the side wall of the a-Si film 109. It is considered that the intermediate layer 111 is comprised of chromium silicide, as described later.

Figure 2D:
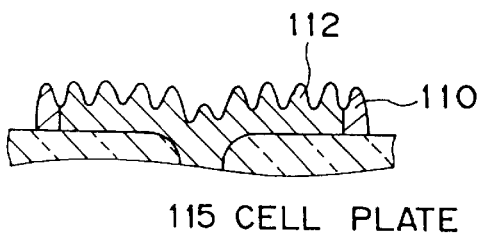

As shown in FIG. 2D, a jagged a-Si film 112 is formed by isotropically dry-etching the top surface of the a-Si film 109 by using a mixture gas of $SF_6/O_2/H_2$. In this embodiment, on condition that the a-Si film 109 is etched to a depth of 300 nm, the difference in height on the jagged surface 112 of the a-Si film 109 is about 150 nm. It is also considered that the unevenness of the intermediate layer 111 is transferred to the surface of the a-Si film 109 to form the jagged surface.

Figure 2E:
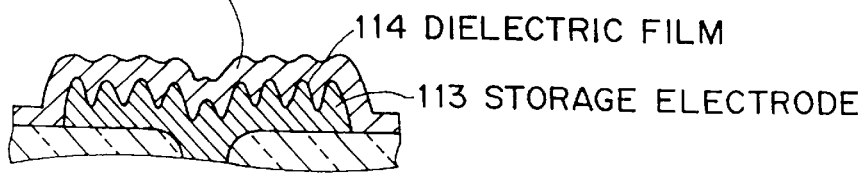

As shown in FIG. 2E, after the chromium film 110 is removed from the side wall by wet-etching with a mixture solution of $H_2SO_4$ and $H_3PO_4$, the jagged a-Si film 109 is poly-crystallized by heating at 650° C. for 5 minutes, and thereby a storage electrode (jagged polycrystalline silicon film) 113 is obtained. Subsequently, a silicon nitride film is deposited on the jagged storage electrode 113 and a dielectric film 114 is formed on the same by thermal oxidation. Finally, a cell plate (upper storage electrode) 115 is formed on the dielectric film 114. In this manner, the capacitor in use for the stacked-capacitor DRAM is completed.

Figure 3A:
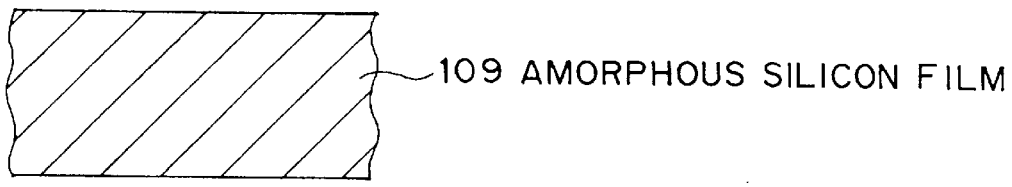
FIGS. 3A–3E are diagrams showing steps of forming the jagged surface of the polycrystalline silicon film in the first embodiment.

The jagged surface formation as shown in FIGS. 2B–2D will be described in detail hereinafter referring to FIGS. 3A–3E. As shown in FIG. 3A, the a-Si film 109 of thickness 400 nm is patterned on the insulation film 107 by the LPCVD method.

Figure 3B:
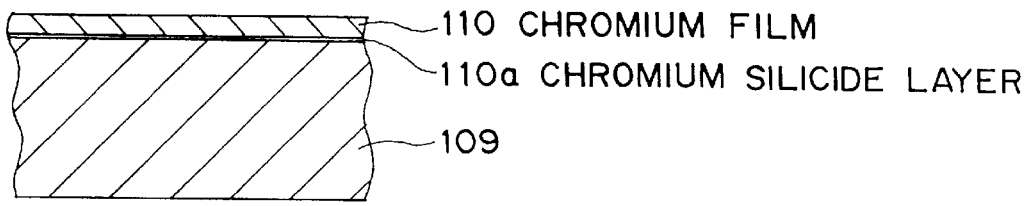
Figure 3C:
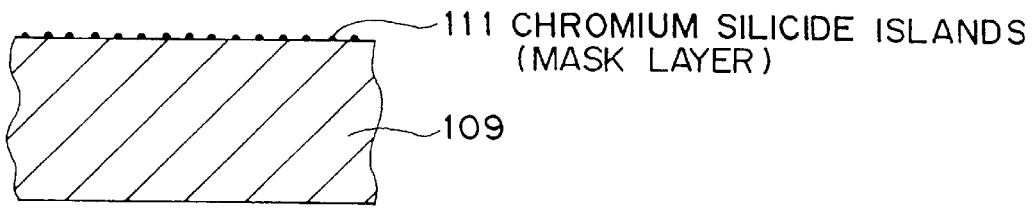

Subsequently, as shown in FIG. 3B, the substrate temperature is set at the room temperature, and a chromium (Cr) film 110 of thickness 150 nm is formed on the a-Si film 109 by sputtering. Consequently, an intermediate layer 110a of thickness about 5–10 nm is formed in the interface between the a-Si film 109 and the chromium film 110. According to our observation, the intermediate layer 110a is a chromium silicide layer which is more thickly formed in the side of the a-Si film 109 than the chromium film 110.

Next, by the anisotropic dry-etching method using a mixture gas of $Cl_2/O_2/H_2$, the chromium film 110 of thickness 150 nm is removed from the a-Si film 109. After the dry-etching removal, it is observed by a high-powered microscope that the surface of the a-Si film 109 is covered with a very thin mask layer 111 having uneven thickness or a lot of thin layer islands.

Figure 3D:
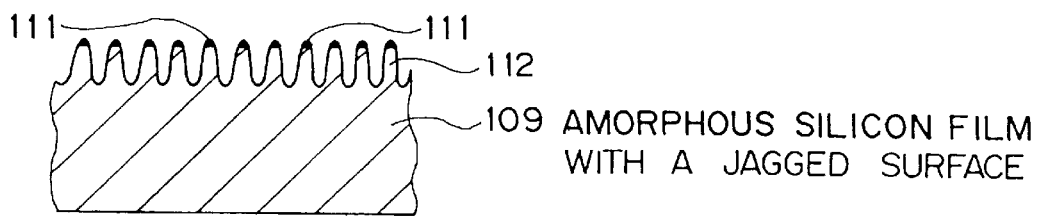
Figure 3E:
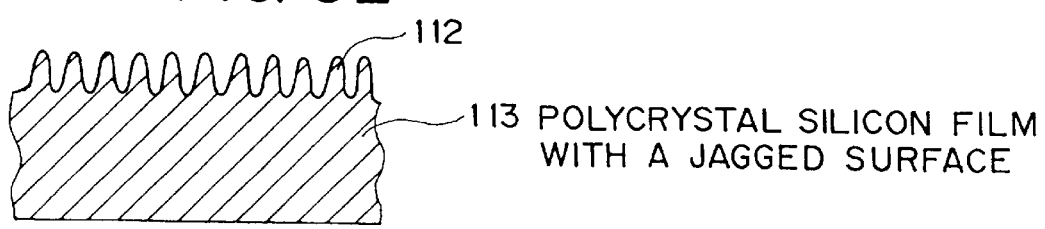

As shown in FIG. 3D, by isotropically dry-etching the surface of the a-Si film 109 with a mixture gas of $SF_6/O_2/H_2$, the jagged a-Si film 112 is formed on the surface of the a-Si film 109. On condition that the a-Si film 109 is etched to a depth of 300 nm, the difference in height on the jagged surface 112 of the a-Si film 109 is about 150 nm. Finally, the jagged a-Si film 109 is poly-crystallized by heating at 650° C. for 5 minutes, and the jagged polycrystalline silicon film 113 is obtained as shown in FIG. 3E.

Figure 4:
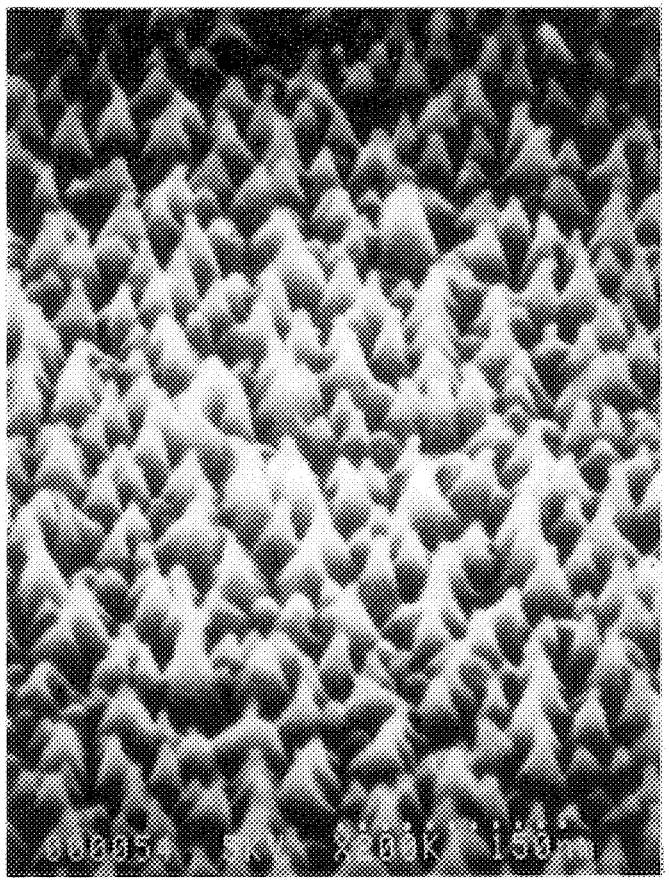
FIG. 4 is a photograph showing an enlarged jagged surface obtained by the first embodiment using an electron microscope.

FIG. 4 shows the result that the jagged surface 112 of the a-Si film 109 thus formed was observed with an electron microscope at a magnification of 200 thousand times. It was experimentally found that the chromium silicide islands 111 dotting the a-Si film 109 play the role of a selective mask and only the exposed amorphous silicon is etched and removed so that the jagged surface structure 112 is formed. Note that the difference in height (depth) of the jagged surface 112 can be easily adjusted by the amount of dry etching.

According to the present embodiment, there is obtained a capacitance which is about 3 times or more as large as in a case where a capacitor is made by the use of an amorphous silicon film having no jagged surface.

Although the chromium film 101 causes the chromium silicide layer 102 to be formed in this embodiment, a similar jagged surface structure can be obtained using high-density heavy metal such as tungsten (W) and titanium (Ti). However, the W or Ti film left on the side wall of the a-Si film 109 as shown in FIG. 2C is removed by a mixture solution of $H_2SO4$ or $H_2O_2$, ammonia and water. Also, the same result can be obtained by employing wet etching method for the etching removal of the chromium film 101 instead of dry-etching.

SECOND EMBODIMENT

Figure 5A:
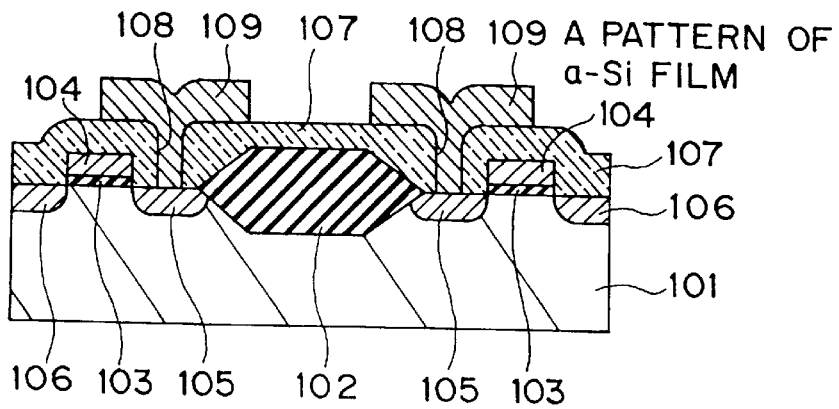
FIGS. 5A–5D are diagrams showing steps of forming a storage electrode having the jagged surface according to a second embodiment of the present invention.

FIGS. 5A–5D show a second embodiment of the present invention. First, as shown in FIG. 5A, the pattern of the a-Si film 109 is formed on the insulation layer 107 with which the cell areas and the field oxide film 102 are covered. The layer structure of this embodiment is identical to that of the first embodiment as shown in FIG. 2A.

Subsequently, the substrate 101 on which the above-mentioned layer structure has been formed is placed in a reaction chamber of the LPCVD apparatus and heated to 200° C. A mixture gas of a tungsten hexafluoride ($WF_6$) gas, a hydrogen ($H_2$) gas and an argon gas is supplied into the reaction chamber on condition that the pressure of the chamber is 6.65 Pa, the partial pressure of the $WF_6$ gas falls within the range from $13.3 \times 10^{-3}$ Pa to $133 \times 10^{-3}$ Pa. In this embodiment, the partial pressure of the $WF_6$ gas is set at $66.5 \times 10^{-3}$ Pa.

Figure 5B:
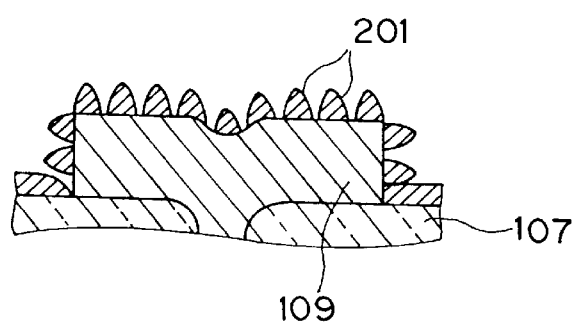

Referring to FIG. 5B, a tungsten layer 201 with the thickness varying is formed on the a-Si film 109 by means of LPCVD under the above-mentioned condition. The tungsten layer 201 consists of a lot of pillars or islands of tungsten of a maximum thickness of 150 nm.

Figure 5C:
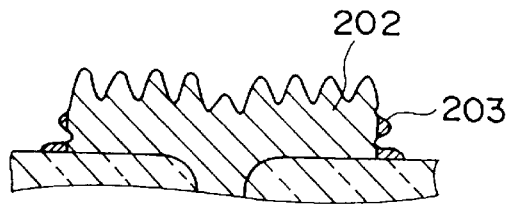

After deposition of the tungsten layer 201, as shown in FIG. 5C, a jagged a-Si film 202 is formed by isotropically dry-etching the surface of the a-Si film 109 with a mixture gas of $SF_6/O_2/H_2$ with using the tungsten layer 201 as an etching mask. On condition that the a-Si film 109 is etched to a depth of 300 nm, the difference in height on the jagged surface of the a-Si film 202 is about 150 nm. Although a partial tungsten islands 203 are left the side wall of the a-Si film 202, they can be removed easily by wet-etching with a mixture solution of $H_2O_2$, ammonia and water. As shown in FIG. 4, the jagged surface of the a-Si film 202 was observed with an electron microscope at a magnification of 200 thousand times.

Figure 5D:
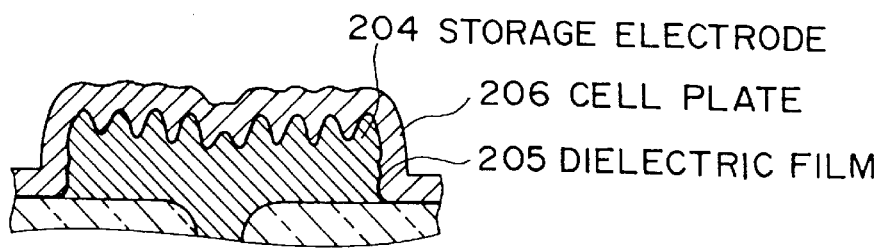

As shown in FIG. 5D, the jagged a-Si film 202 is polycrystallized by heating at 650° C. for 5 minutes in a vacuum or an oxygen-free atmosphere, and thereby a storage electrode (jagged polycrystalline silicon film) 204 is obtained. Subsequently, a silicon nitride film is deposited on the jagged storage electrode 204 and a dielectric film 205 is formed on the same by thermal oxidation. Finally, a cell plate (upper storage electrode) 206 is formed on the dielectric film 205. In this manner, the capacitor in use for the stacked-capacitor DRAM is completed. According to the present embodiment, there is also obtained a capacitance which is about 3 times or more as large as in a case where a capacitor is made by the use of an amorphous silicon film having no jagged surface.

In this embodiment, it is important to grow the tungsten layer 201 in pillars or islands on the a-Si film 109. The shape of the pillar or island tungsten is dependent on the partial pressure of the $WF_6$ gas when growing. If the partial pressure of the $WF_6$ gas falls within the range from $13.3 \times 10^{-3}$ Pa to $133 \times 10^{-3}$ Pa, then pillars or islands of tungsten are formed on the a-Si film 109. Therefore, the tungsten layer 201 which is deposited under this condition can be used as the etching mask to form the jagged surface.

Furthermore, each pillar or island of tungsten varies in width according to the partial pressure of the $WF_6$ gas ranging from $13.3 \times 10^{-3}$ Pa to $133 \times 10^{-3}$ Pa when growing. Experimentally, a pillar or island of about 50 nm in width is formed on condition that the partial pressure of the $WF_6$ gas falls within the range from $13.3 \times 10^{-3}$ Pa to $66.5 \times 10^{-3}$ Pa, and a pillar or island of about 100 nm in width is formed on condition that the partial pressure of the $WF_6$ gas falls within the range from $66.5 \times 10^{-3}$ Pa to $133 \times 10^{-3}$ Pa. Since the pillars or islands of tungsten are used as the etching mask, the above-mentioned etching process causes each needle-like protrusion of the jagged surface varying in width according to the width of the pillar or island of tungsten. An optimal width of the needle-like protrusion of the jagged surface may be determined depending on the size of the stacked-capacitor and the isolation distance between devices of the DRAM. Therefore, an optimal width of each needle-like protrusion of the jagged surface can be easily obtained according to the present embodiment.

THIRD EMBODIMENT

It is preferable that the crest of each needle-like protrusion of the jagged surface is rounded and the stacked-capacitor is formed on the jagged surface with rounded protrusions of the storage electrode.

Figure 6A:
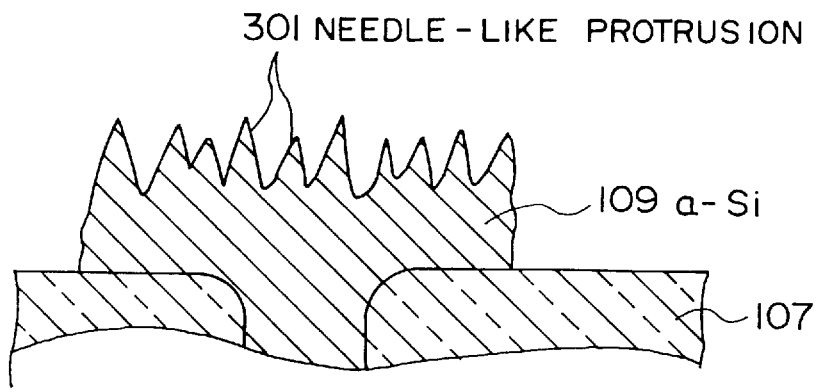
FIGS. 6A–6C are diagrams showing steps of forming a storage electrode whose surface has rounded jaggies according to a third embodiment of the present invention.

FIG. 6A shows the a-Si film 109 with the jagged surface comprising many needle-like protrusions 301 thereon. Such a jagged surface of the a-Si film 109 is obtained as described above in FIGS. 2D and 5C.

Figure 6B:
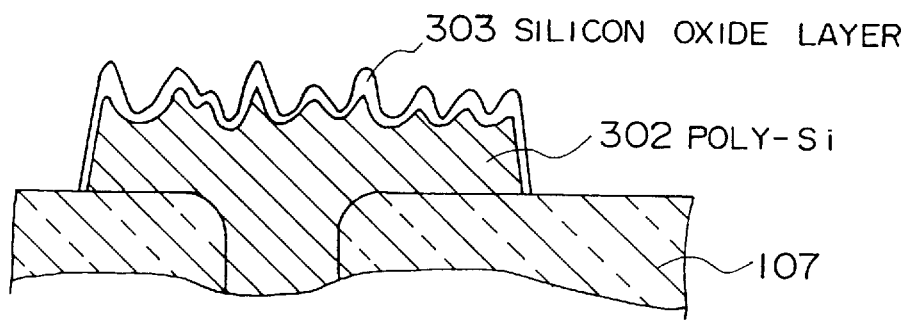

Subsequently, as shown in FIG. 6B, the jagged surface of the a-Si film 109 is oxidized to a silicon oxide layer 303 by oxidation in dry-oxygen atmosphere at 900° C. in a diffusion furnace. Concurrently, the a-Si film 109 is poly-crystallized to a polycrystalline silicon film 302 which serves as a storage electrode. The oxidation of the jagged surface causes the crest of each needle-like protrusion to be rounded, because the silicon oxide layer 303 is growing in any surface of the a-Si film 109.

Figure 6C:
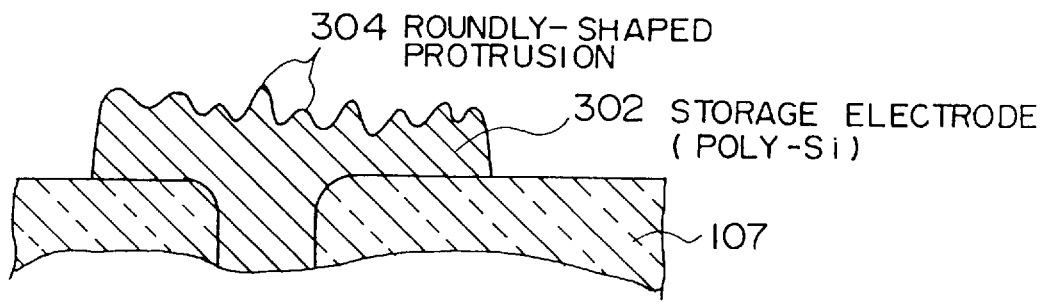

After oxidation, as shown in FIG. 6C, the silicon oxide layer 303 is removed by dilute hydrofluoric acid to form roundly-shaped protrusions 304 of the storage electrode (polycrystalline-Si) 302. This removal process causes very little change in shape of each rounded protrusion of the jagged surface but a little reduction in width of each rounded protrusion.

Subsequently, similar to the first and second embodiments, a silicon nitride film is deposited on the jagged storage electrode 302 and a dielectric film is formed on the same by thermal oxidation. Finally, a cell plate (upper storage electrode) is formed on the dielectric film. In this manner, the capacitor in use for the stacked-capacitor DRAM is completed.

Figure 7:
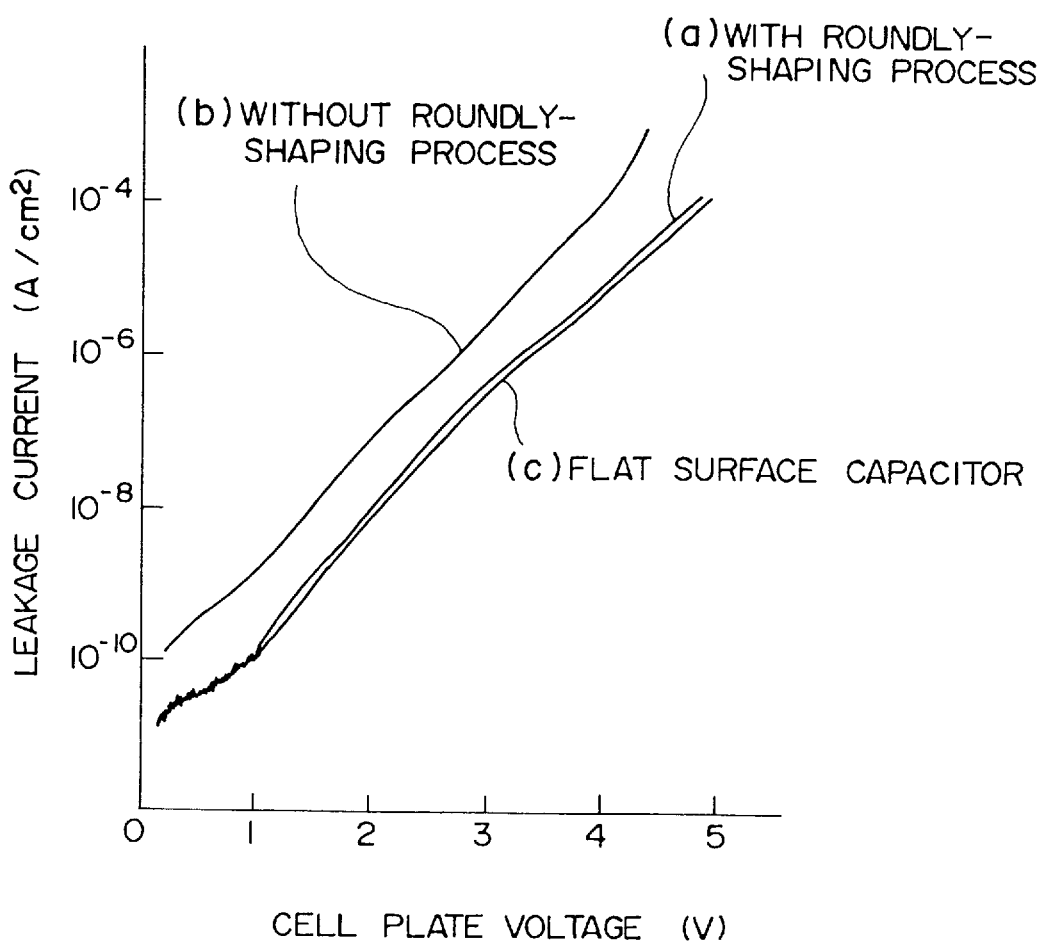
FIG. 7 is a graph showing leakage current dependence on cell plate voltage for comparison between the presence and the absence of the round-shaping step.

FIG. 7 shows leakage current characteristics obtained by averaging the measurements of a hundred thousand sample capacitors. As shown in this graph, the leakage current of the capacitor with rounded protrusions (a) as mentioned in the third embodiment is one order of magnitude smaller than with needle-like protrusions (b). The roundly-shaped capacitor (a) performs approximately as well in leakage current as a flat surface capacitor (c). The reason is that the rounded-shaped crests of protrusions cause the concentration of electric fields due to protrusions of the opposite storage electrodes to be remarkably reduced.

Figure 8A:
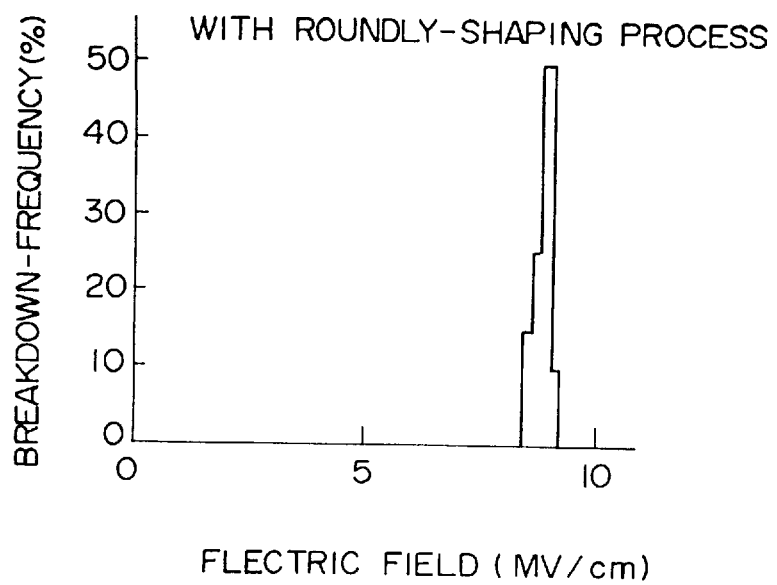
FIG. 8A is a graph showing breakdown fields distribution in the presence of the round-shaping step.
Figure 8B:
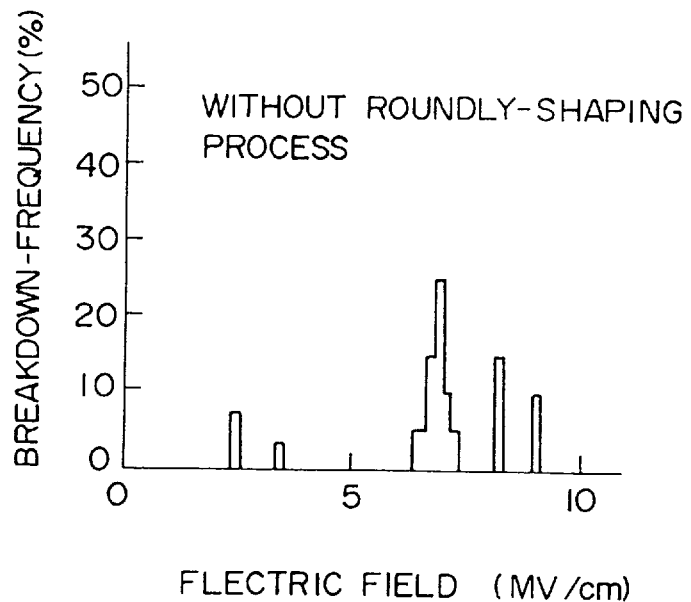
FIG. 8B is a graph showing breakdown fields distribution in the absence of the round-shaping step.

FIG. 8A shows a breakdown fields distribution obtained by measuring a hundred thousand sample capacitors with a jagged surface having rounded protrusions, and FIG. 8B shows a breakdown fields distribution obtained by measuring a hundred thousand sample capacitors with a jagged surface having needle-like protrusions. As shown in FIG. 8A, the sharp peak of the breakdown-field distribution appears only in the specific electric field region, and no breakdown failure in low electric fields is observed. Compared with the case as shown in FIG. 8B, it is found that the rounded-shaped crests of protrusions cause the concentration of electric fields due to protrusions of the opposite storage electrodes to be remarkably reduced.

The rounded protrusions of the jagged surface may be formed by annealing. More specifically, the rounded crests of protrusions are formed by heating the a-Si film 109 as shown in FIG. 6A to 800°–900° C. in a very high vacuum of $133 \times 10^{-6}$ Pa or less, preferably about $133 \times 10^{-10}$ Pa. The reason is that the heating causes silicon atoms existing on the surface of the a-Si film 109 to evaporate.

The rounded protrusions may be also formed by laser annealing. More specifically, when the surface of the a-Si film 109 is irradiated with the laser beam of an excimer laser of energy-density 200–400 mJ/cm$^2$, preferably 300 mJ/cm$^2$ in oxygen-free atmosphere, the needle-like crests are fused to the rounded crests as shown in FIG. 6C.

Although, in the above-described embodiments, the step of forming the jagged surface follows the patterning step, it is apparent that the patterning step may be performed after the jagged surface forming step.

Although the subject invention has been described with relation to the preferred embodiments, various modifications and adaptations thereof will now be apparent to those skilled in the art. All such modifications and adaptations as fall within the scope of the appended claims are intended to be covered thereby.

What is claimed is:

1. A method of forming a capacitor comprising a dielectric film intervening between a first electrode and a second electrode, said method comprising the steps of:
    a) preparing a substrate having at least one device area thereon;
    b) forming an amorphous silicon film on said device area, said amorphous silicon film containing one type of dopant;
    c) forming a mask layer comprising mask islands distributed on a surface of said amorphous silicon film;
    d) dry-etching said surface of said amorphous silicon using said mask layer as a selective etching mask into a jagged surface having protrusions;
    e) changing said amorphous silicon film with said jagged surface thereon into a polycrystalline silicon film serving as said first electrode;
    f) depositing said dielectric film on said jagged surface of said first electrode; and
    g) forming said second electrode on said dielectric film.

2. The method as set forth in claim 1, wherein said step (c) comprises:
    depositing a metal film on said amorphous silicon film to produce an intermediate layer in an interface between said metal film and said amorphous silicon film, said intermediate layer comprising a compound formed by reaction of a metal material of said metal film with a silicon material of said amorphous silicon film; and
    removing said metal film from said surface of said amorphous silicon film by anisotropic etching such that said intermediate layer is left in a pattern of islands on said surface of said amorphous silicon film, said intermediate layer left being used as said mask layer.

3. The method as set forth in claim 2, wherein the metal film comprises chromium (Cr).

4. The method as set forth in claim 2, wherein the metal film comprises tungsten (W).

5. The method as set forth in claim 2, wherein the metal film comprises titanium (Ti).

6. The method as set forth in claim 2, further comprising a rounding step of round-shaping said protrusions of said jagged surface, said rounding step following said step (d).

7. The method as set forth in claim 6, wherein said rounding step comprises:
    oxidizing said jagged surface of said amorphous silicon film to form a silicon oxide layer in said jagged surface; and
    removing said silicon oxide layer from said jagged surface of said amorphous silicon film.

8. The method as set forth in claim 6, wherein said rounding step comprises:
    heating said amorphous silicon film in a dry oxygen atmosphere such that said amorphous silicon film is changed into said polycrystalline silicon film and a silicon oxide layer is formed in said jagged surface; and
    removing said silicon oxide layer from said jagged surface of said polycrystalline silicon film, and
    said steps (f) and (g) follows said rounding step.

9. The method as set forth in claim 8, wherein said step of heating said amorphous silicon film is performed such that said amorphous silicon film is heated in a dry oxygen atmosphere at 900° C. for 10 minutes.

10. The method as set forth in claim 6, wherein said rounding step follows said step (e) and is performed by annealing said polycrystalline silicon film.

11. The method as set forth in claim 10, wherein said rounding step is performed by annealing said polycrystalline silicon film in a vacuum of below $133 \times 10^{-6}$ Pa and at a temperature ranging from 800° to 900° C.

12. The method as set forth in claim 11, wherein said rounding step is performed by annealing said polycrystalline silicon film in a vacuum of $133 \times 10^{-10}$ Pa and at a temperature ranging from 800° to 900° C.

13. The method as set forth in claim 10, wherein said rounding step is performed by using a laser beam to anneal said jagged surface of said polycrystalline silicon film in an oxygen-free atmosphere.

14. The method as set forth in claim 13, wherein said laser beam has an energy density ranging from 200 to 400 mJ/cm$^2$.

15. The method as set forth in claim 14, wherein said laser beam has an energy density of 300 mJ/cm$^2$.

16. The method as set forth in claim 1, wherein said step (c) comprises:

placing said substrate having said amorphous silicon film formed within a chamber for use in CVD (chemical vapor deposition);

supplying a mixture gas into said chamber, said mixture gas comprising a tungsten hexafluoride (WF$_6$) gas and a hydrogen (H$_2$) gas; and depositing tungsten islands distributed on said surface of said amorphous silicon film by CVD on condition that a partial pressure of said WF$_6$ gas falls within a predetermined range which depends on a desired shape of each said tungsten islands, said tungsten islands being used as said mask layer.

17. The method as set forth in claim 16, wherein said predetermined range spans from $13.3 \times 10^{-3}$ Pa to $133 \times 10^{-3}$ Pa.

18. The method as set forth in claim 17, wherein a width of each said tungsten islands is varied in accordance with said partial pressure of said WF$_6$ gas.

19. The method as set forth in claim 16, further comprising a rounding step of round-shaping said protrusions of said jagged surface, said rounding step following said step (d).

20. The method as set forth in claim 19, wherein said rounding step comprises:

oxidizing said jagged surface of said amorphous silicon film to form a silicon oxide layer in said jagged surface; and removing said silicon oxide layer from said jagged surface of said amorphous silicon film.

21. The method as set forth in claim 19, wherein said rounding step comprises:

heating said amorphous silicon film in a dry oxygen atmosphere such that said amorphous silicon film is changed into said polycrystalline silicon film and a silicon oxide layer is formed in said jagged surface; and removing said silicon oxide layer from said jagged surface of said polycrystalline silicon film, and said steps (f) and (g) follows said rounding step.

22. The method as set forth in claim 21, wherein said step of heating said amorphous silicon film is performed such that said amorphous silicon film is heated in a dry oxygen atmosphere at 900° C. for 10 minutes.

23. The method as set forth in claim 19, wherein said rounding step follows said step (e) and is performed by annealing said polycrystalline silicon film.

24. The method as set forth in claim 23, wherein said rounding step is performed by annealing said polycrystalline silicon film in a vacuum of below $133 \times 10^{-6}$ Pa and at a temperature ranging from 800° to 900° C.

25. The method as set forth in claim 24, wherein said rounding step is performed by annealing said polycrystalline silicon film in a vacuum of $133 \times 10^{-10}$ Pa and at a temperature ranging from 800° to 900° C.

26. The method as set forth in claim 23, wherein said rounding step is performed by using a laser beam to anneal said jagged surface of said polycrystalline silicon film in an oxygen-free atmosphere.

27. The method as set forth in claim 26, wherein said laser beam has an energy density ranging from 200 to 400 mJ/cm$^2$.

28. The method as set forth in claim 27, wherein said laser beam has an energy density of 300 mJ/cm$^2$.

29. The method as set forth in claim 1, further comprising a rounding step of round-shaping said protrusions of said jagged surface, said rounding step following said step (d).

30. The method as set forth in claim 29, wherein said rounding step comprises:

oxidizing said jagged surface of said amorphous silicon film to form a silicon oxide layer in said jagged surface; and removing said silicon oxide layer from said jagged surface of said amorphous silicon film.

31. The method as set forth in claim 29, wherein said rounding step comprises:

heating said amorphous silicon film in a dry oxygen atmosphere such that said amorphous silicon film is changed into said polycrystalline silicon film and a silicon oxide layer is formed in said jagged surface; and removing said silicon oxide layer from said jagged surface of said polycrystalline silicon film, and said steps (f) and (g) follows said rounding step.

32. The method as set forth in claim 31, wherein said step of heating said amorphous silicon film is performed such that said amorphous silicon film is heated in a dry oxygen atmosphere at 900° C. for 10 minutes.

33. The method as set forth in claim 29, wherein said rounding step follows said step (e) and is performed by annealing said polycrystalline silicon film.

34. The method as set forth in claim 33, wherein said rounding step is performed by annealing said polycrystalline silicon film in a vacuum of below $133 \times 10^{-10}$ Pa and at a temperature ranging from 800° to 900° C.

35. The method as set forth in claim 34, wherein said rounding step is performed by annealing said polycrystalline silicon film in a vacuum of $133 \times 10^{-10}$ Pa and at a temperature ranging from 800° to 900° C.

36. The method as set forth in claim 33, wherein said rounding step is performed by using a laser beam to anneal said jagged surface of said polycrystalline silicon film in an oxygen-free atmosphere.

37. The method as set forth in claim 36, wherein said laser beam has an energy density ranging from 200 to 400 mJ/cm$^2$.

38. The method as set forth in claim 37, wherein said laser beam has an energy density of 300 mJ/cm$^2$.

39. The method as set forth in claim 1, further comprising a patterning step of patterning said amorphous silicon film, said patterning step following said step (d).

40. The method as set forth in claim 1, further comprising a patterning step of patterning said amorphous silicon film, said step (d) following said patterning step.

* * * * *